United States Patent [19]
Meissner

[11] Patent Number: 5,441,803
[45] Date of Patent: Aug. 15, 1995

[54] COMPOSITES MADE FROM SINGLE CRYSTAL SUBSTANCES

[75] Inventor: Helmuth E. Meissner, Pleasanton, Calif.

[73] Assignee: Onyx Optics, Pleasanton, Calif.

[21] Appl. No.: 919,374

[22] Filed: Jul. 29, 1992

Related U.S. Application Data

[60] Continuation of Ser. No. 672,251, Mar. 20, 1991, abandoned, which is a continuation-in-part of Ser. No. 597,987, Oct. 15, 1990, abandoned, which is a continuation of Ser. No. 446,214, Dec. 5, 1989, abandoned, which is a division of Ser. No. 238,563, Aug. 30, 1988, abandoned.

[51] Int. Cl.$^6$ ............... B32B 31/00; C30B 33/00
[52] U.S. Cl. ............... 428/220; 428/408; 428/411.1; 428/700; 156/60
[58] Field of Search ............... 428/1, 411.1, 192, 331, 428/220, 700

[56] References Cited

U.S. PATENT DOCUMENTS

| | | |
|---|---|---|
| 3,565,508 | 2/1971 | DuMont . |
| 3,880,632 | 4/1975 | Podvigalkina . |
| 4,149,902 | 4/1979 | Mauer et al. . |
| 4,531,809 | 7/1985 | Carter et al. . |
| 4,638,552 | 1/1987 | Shimbo et al. . |
| 4,810,318 | 3/1989 | Haisma et al. . |

FOREIGN PATENT DOCUMENTS

| | | |
|---|---|---|
| 0136050 | 5/1984 | European Pat. Off. . |
| 0232935 | 1/1987 | European Pat. Off. . |

OTHER PUBLICATIONS

McLellan, G. W., Glass Engineering Handbook, Third Edition, pp. 1–1 to 1–3 and 4–4 to 4–11.

Primary Examiner—P. C. Sluby
Attorney, Agent, or Firm—Townsend and Townsend Khourie and Crew

[57] ABSTRACT

This invention relates to a method for forming, and constructs of, bonded composites of single crystal materials. The method comprises the steps of optically contacting the surfaces of the single crystal materials selected to form an assembly, bonding the surfaces by gradually heating the assembly to a temperature and for a duration sufficient to diffusion bond the surfaces, and cooling the bonded assembly at a rate which avoids thermal shock and allows the removal of stress by annealing. No bonding agents are necessary. Moreover, since the bonding temperature does not have to reach the substances' melting or fusing temperature, minimal distortion and displacement of the surfaces results.

9 Claims, 2 Drawing Sheets

COMPOSITES MADE FROM SINGLE CRYSTAL SUBSTANCES

This is a Continuation of application Ser. No. 07/672,251 filed Mar. 20, 1992, now abandoned, in turn a Continuation-in-part of application Ser. No. 07/597,987 filed Oct. 15, 1990, now abandoned, in turn a Continuation of application Ser. No. 07/446,214 filed Dec. 5, 1989, abandoned, in turn a Divisional of application Ser. No. 07/238,563 filed Aug. 30, 1988, abandoned.

BACKGROUND OF THE INVENTION

1. Field of the Invention

The present invention relates generally to methods of forming composite structures for scientific and technical uses. More particularly, the present invention relates to methods of bonding materials such as glass, and composites of glass and glass ceramics, or single crystals without the use of bonding agents, at temperatures lower than the melting temperatures of the materials to be bonded. The glass laminates of the present invention are particularly well-suited for use in filter glass and laser glass applications.

2. Description of the Prior Art

In many endeavors of science and industry, instruments and devices utilizing structures comprising glass-containing substances are necessary to produce certain important scientific phenomena and to provide proper and efficient operation of certain scientific and engineering devices. For example, plate glass structures are useful in solid state lasers. Also, adhesively-bonded glass laminates have been employed in filter glasses used in optic systems.

Methods described in the prior art for bonding glass surfaces include holding the surfaces together using adhesive or bonding agents, followed by heating to a molten state. For instance, U.S. Pat. No. 4,149,902 discloses the use of a transparent bonding adhesive. U.S. Pat. No. 3,880,632 discloses the use of a binding layer of silica on one surface, followed by heating by infrared radiation.

Other variants on the general concept of bonding silicon bodies by means of an intermediate layer are those such as disclosed in European Patent Application No. 0 232 935 which suggests bonding of a glass body to a semiconductor body with use of an intermediate thermally grown oxide layer. Similarly, U.S. Pat. No. 4,810,318 discloses forming an optical laminate filter by bonding two glass parts by means of wringing in contact the glass parts through an intermediate vapor-deposited indium-tin oxide layer. The U.S. Pat. No. 4,810,318 also refers to other conventional bonding layers such as an epitaxial monocrystalline layer, for example, Si on GaP or $(PbLa)(ZrTi)O_3$ on sapphire. Also, U.S. Pat. No. 4,638,552 suggests bonding silicon bodies with use of an intermediate thermal oxide or impurity layer. Lastly, U.S. Pat. No. 4,531,809 discloses an optical waveguide coupling device including a silicon part attached to a polymer film over an intermediate thin metal film.

However, the aforementioned methods are not totally satisfactory since the use of bonding agents may affect optical quality, and present considerable difficulties and inconvenience. For instance, in using a bonding agent, the optical characteristics of the bonding agent would have to be compatible with the materials to achieve optical homogeneity. Further, if the interface between components is contaminated during contact, the bonding agent would prevent easy separation of the surfaces for cleaning and recontacting. If high heating temperatures are used, the high temperatures and molten state make it difficult to (1) control the flatness of the element interfaces, (2) keep the interfaces free of contamination by dust and gas bubbles, and (3) achieve optical homogeneity of the layers because of possible distortions.

Accordingly, given the above-mentioned significant drawbacks associated with the use of intermediate bonding layers in bonding glass parts, other prior art approaches have been attempted. For instance, another method proposed for bonding a laminate assembly involves attaching one substrate of borosilicate glass to a silicon wafer without the use of intervening adhesive layers and heating to a glass transition point or a higher temperature such as seen in European Patent Application No. 0 136 050. The borosilicate glass/single crystal silicon wafer composite was found inferior to a single crystal silicon wafer/single crystal silicon wafer composite for semiconductor pressure transducer applications.

However, no explanation is offered in European Patent Application 0 136 050 for the difference in strength observed between the borosilicate glass/silicon wafer composite and the silicon wafer/silicon wafer composite. It is possible that the borosilicate glass will hydrate more extensively than the silicon surface since this glass contains additional other components such as alkali and borate which also undergo hydration. As a consequence, the hydrated layer of the borosilicate glass can be expected to be thicker and to contain a higher water content than the silicon wafer. The thicker layer at the interface of the borosilicate glass tends to adversely effect the bond strength because hydrogen bonding therein is recognized as giving a weaker bond in comparison to the glass network bond, such as Si—O—Si bonds, at the interface of the silicon wafer/silicon wafer composite.

In the latter situation, water of condensation will remain at the interface because the heating temperature used in European Patent Application 0 136 050 is maintained too low for diffusion to occur.

That is, the single crystal wafer bonding embodiment in European Patent Application 0 136 050 strongly suggests that the presence of oxide films (silicon oxides, dioxides and/or hydroxide groups) on the surfaces to be joined are responsible for increasing the bonding strength of the silicon-silicon composite. These oxide layers may only be one to a few molecular layers thick; however, European Patent Application 0 136 050 indicates that the mechanisms of silanol condensation in the oxide films are operative to effect the bonding of the silicon wafers. Moreover, European Patent Application 0 136 050 states that the silicon bodies were not bonded by mutual diffusion mechanisms.

In a different embodiment, European Patent Publication 0 136 050 also suggests that two glass parts can be joined by merely mutually contacting the glass surfaces at ambient non-heated conditions. In this regard, the reference speculates that alkali metal ions from one glass part are possibly dissolving into the water-adsorbing surface regions of the other glass part. However, this explanation is not considered theoretically plausible given the nature of the alkali metal ions and common glass substrates involved together with the ambient bonding temperature condition. Other prior methods for forming composite glass parts without use of intervening bonding layers are described below.

For example, thin, laminated glass composites have been produced by co-extrusion from slit-shaped orifices followed by the joining of melt-softened glass sheets. This method, however, will not provide the optical homogeneity necessary for laser applications. Further, this method is incapable of producing glass sheets thicker than approximately 5 to 10 mm; and such composites also lack structural rigidity.

The molten glass method involves casting layers of molten glass, one on top of another, and allowing each layer to cool and solidify. However, this method has disadvantages because the flatness of the glass interface and the desire to maintain a contamination-free environment of the glass interface are difficult to control in the molten state. Moreover, since the molten state subjects the layers of the glass composite to thermal stress, optical homogeneity is difficult to maintain.

Techniques for optically contacting glass parts have been considered heretofore. For instance, a method involving optical contacting using bonding agents is disclosed in U.S. Pat. No. 3,565,508. Although this process is simple conceptually, it is more complicated to actually implement due to, among other factors, the pervasive requirement of extreme cleanliness required of glass surfaces to be optically contacted.

Also, most filter glasses need an optical thin film coating. This coating has to be deposited prior to lamination with cement or adhesive because the cement or adhesive would decompose at coating processing conditions. Therefore, great care has to be taken not to damage this coating during the lamination process.

However, as explained below, optical contacting between optically flat surfaces, without bonding agents, is possible. This bonding can be attributed to Van der Waals attractive forces acting at opposing contact points and surfaces. Such bonding remains stable so long as the components of the composite are not subjected to temperature gradients, which cause non-uniform expansion, and resultant stress sufficient to overcome this bond strength. However, the bond may also be broken by inserting a thin strong object, for instance, a razor blade in between the optically contacted surfaces. For reference, see G. W. McLellan et al., *Glass Engineering Handbook*, 3d ed., which describes heating and cooling of glasses.

As made apparent by the discussions above, there remains a need for high quality large glass or glass-containing structures useful for various technological applications. Conventional optical filter glasses or large glass structures constructed in the desired sizes lack optical quality and structural endurance. Moreover, traditional methods for forming laser quality composites are limited, thus far, to materials capable of remaining stable at high bonding temperatures and pressures. Finally, the use of extraneous bonding agents presents difficulties in contamination control, optical quality and other undesirable effects.

Accordingly, this field of technology has awaited proposals which might offer solutions to the above problems encountered in past attempts to provide composite glass-containing structures. However, the need for providing structures of materials of which the optical properties are being utilized is not limited to glass-containing structures, but also extends to crystalline structures necessary for laser harmonic generation, electro-optical Q-switching, and in moderate to high average power solid state lasers.

Conventional approaches to providing such large crystalline structures for these applications have proven unsatisfactory. For example, traditionally, large single crystal materials have been grown, but this is necessarily a slow and complex process, with the costs increasing as the crystal size increases. Moreover, many crystals can only be grown to a limited size which is frequently smaller than desired for intended applications. For example, Nd:YAG (i.e., yttrium aluminum garnet) crystals, commonly used in lasers, can only be readily grown into only about one inch diameter crystal boules; larger boules suffer from imperfect cores, which effectively reduce the usable dimensions of the boule, and non-uniform dopant concentrations.

Another method of producing large crystalline structures is to construct composites of single crystals, or composites of different crystalline substances. Fabricating composite large single crystals is more cost-effective than growing large crystals, and multiple composites can provide needed structural support to the crystalline structure. However, traditional methods of bonding crystalline materials require relatively high temperatures and/or pressures, so only those crystals which are stable at those bonding temperatures and/or pressures could be produced. For example, the process of epitaxial growth (i.e., the layering of single crystals on tope of a single crystal substrate) requires exposing the substrate to a high temperature flux melt.

More specifically, one method of growing epitaxial layers consists of immersing the substrate crystal into a flux at temperatures of up to about 1400° C. to deposit an epitaxial layer onto the substrate crystal on all of its exposed surfaces. However, it is difficult to mask crystal surfaces on which such an epitaxially grown layer is not desired, since a mask material capable of withstanding the flux temperatures generally does not exist. Moreover, this particular method presents the risk of breakage due to thermal shock and/or stress, and damage or partial loss of substrate material due to the difficulties of controlling the outcome of the epitaxial growth process. This problem is particularly severe when expensive, large single crystal slabs—which take several months to grow—such as, for example, Nd, Cr:GSGG (i.e., gadolinium scandium gallium garnet) are involved.

Accordingly, a need also exists in the art for the provision of a technique to provide large crystalline structures which overcomes and avoids the above-discussed shortcomings of the conventional approaches.

SUMMARY OF THE INVENTION

The present invention provides a formation method for, and constructs of, bonded glass laminates or bonded laminate composites of glass and glass-containing substances such as glass ceramics, or bonded single crystal structures. The methods of the instant invention neither require the use of bonding agents, nor heating at temperatures above the melting temperature (if crystalline containing substances are used), or the transition temperature (if glass-containing substances are used), of the substances.

One object of the present invention is to provide a diffusion-bonded device, and a method for making such a device, which has optical homogeneity despite the fact that more than one glass-containing material is incorporated into the bonded assembly. Towards this end, the present invention provides for optically contacting surfaces of at least first and second glass-containing materials to initially form an assembly. Then, the optically contacted surfaces are gradually heated to a temperature below the fusion temperature of said surfaces, but at a temperature and for a time sufficient to diffusion bond the surfaces. Afterwards, the bonded structure is cooled at a rate which allows the removal of stress by annealing.

The term "diffusion bonding" as used in the present invention is related to the same term as typically used for solid phase joining, usually of metals with glass or ceramics. Examples of such conventional solid phase joining are described in "Ceramic Joining" by Mel M. Schwartz, ASM International, 1990. In particular, the term "diffusion bonding" as used in the present invention describes diffusion of ions and vacancies occuring at the interface. Although the phenomenon is not entirely understood, the ions diffusing at glass-glass interfaces are considered to be mainly alkali ions when these type of ions are present in the glass.

However, alkali-free pure silica glass also can be bonded by the technics of the present invention. In fact, Applicants have discovered that one of the most impressive glass-glass bonds is attained with alkali-free pure silica glass because no visible interface remains and the composite appears in the nature of a single piece of glass without a dividing line. In this last-mentioned arrangement, Applicants theorize that a rearrangement occurs in the silica network structure at the interface, and, also possibly diffusion of oxygen ions.

When bonding single crystals such as garnets, e.g., $Y_3Al_5O_{12}$ (YAG), the diffusion bonding process of the present invention may also involve diffusion of oxygen ions, of vacancies away from the interface into the bulk, and possibly some adjustment of the crystalline lattice, structure. In general, single crystals are heated to a temperature at which diffusion of a species in the crystal lattice can take place. With oxide crystals, diffusing species may be alkali ions, oxygen ions or vacancies. Vacancy diffusion is generally described in "Diffusion In Crystalline Solids," edited by G. E. Murch et al., Academic Press Inc., 1984.

In other crystals, halide ions such as fluoride or chloride may also participate in diffusion. Hydrogen ion diffusion would be expected to be an important mechanism in crystals with water of hydration in its structure. When two single crystals are in optical contact, vacancies will have a very high concentration at the interface because the individual surfaces are not flat (and not free of impurities) on an atomic scale. Diffusion allows these vacancies (together with impurity ions) to move away from the interface and redistribute themselves in the bulk of the crystal, eventually creating an interface which resembles the bulk in properties. This phenomenon is especially true if the two crystal components are aligned in the same crystallographic orientation. However, bonding has been obtained by Applicants also with arbitrary orientation of the two crystals with respect to each other.

Having explained above the phenomenon of diffusion bonding as it pertains to the present invention, the discussion below turns to the protocol involved with practicing the present invention.

Preferably, where the glass-containing materials are selected having different glass transition temperatures, the bonding temperature corresponds to about 0.8 to about 1.3 times the value of the lower of the respective surfaces glass transition temperature. Applicants have found that this bonding method is generally applicable to oxide glasses, i.e. silicate based glasses, phosphate-based glasses and the like. Applicants believe that the bonding technics of the present invention should have operational utility in all glasses where diffusion across the interface can occur, e.g. fluoride glasses. Surprisingly, the low bonding temperatures sufficient for bonding without a bonding agent, make the methods of the present invention extremely convenient, easy, and inexpensive to employ.

Another object of the present invention is the provision of diffusion bonded glass-containing materials where the same type of materials are selected from the group consisting of glass and glass ceramics. Also, when glass-containing materials are selected which have approximately the same glass transition temperature, then the bonding temperature corresponds to about 0.8 to about 1.3 times the glass transition temperature of both of the materials. Further, it is desirable that the first and second glass-containing materials have similar thermal expansion coefficients, e.g., within about $\pm 5 \times 10^{-7}/°C$. of each other.

Another object of the present invention is the provision of a diffusion bonded device, and a method of making same, wherein a third glass-containing material is positioned as an intervening layer in-between the first and second glass-containing layers which have a lower coefficient of thermal expansion than the third glass-containing layer. One preferred example of this embodiment of the present invention involves first and second glass-containing layers comprising borosilicate glass and the middle third glass-containing layer comprising phosphate glass.

Thus, the methods of the present invention avoid the problems of tacky bonding agents comprised different materials which may affect optical quality and make handling difficult. That is, since there is no adhesive or cement used, the laminates are insensitive to temperatures at which organic polymers decompose, insensitive to delamination due to environmental exposures and may be hermetically sealed with glass frits into their fixtures. Moreover, the present invention avoids deformation and contamination of the composites, which may result from high bonding temperatures.

As another advantage of the present invention, the integrity of the optical surface finish provided on the components is preserved during heat treatment used for effecting diffusion bonding. The process of the present invention permits filter glass laminate to be formed by bonding prior to application of the optical coating. Accordingly, the present invention is more flexible than the prior art technics using intervening bonding layers since the optical finishing coat can be applied before or after conducting the bonding step in the practice of the present invention.

Additional steps may be inserted for various other purposes. For example, often, large glass structures tend to sag due to their size and weight, thus, to ensure that the composites remain flat, the elements to be bonded may be supported with a precision ground support surface made of, for example, graphite, fused silica coated with a release agent, or polycrystalline ceramic. Moveover, in order to provide composite structures which are substantially devoid of contamination, such as for example, dust particles, water, or air pockets, further aspects of the method of the present invention include preheating of the surfaces to be bonded to remove adsorbed gases and water; sealing the inter-face between the surfaces to be bonded to keep out contaminants; and performing the method in controlled environments such as, for example, vacuum furnaces or in low humidity helium or oxygen glove boxes.

The glass laminate bonding methods and constructs of the present invention have wide-ranging applicability. For instance, the constructs of the present invention can be used as laminated optical filter elements which are applied over instrument panels, e.g., in airplane cockpits, which absorb infrared radiation in a wavelength range in which nightvision goggles operate. The optical filter element also serves to filter out such wavelengths of light eminating from the instrument panels which otherwise would reach the user of nightvision goggle equipment and would interfere with the ability of the viewer to discern and distinguish details in the starlit landscapes.

Also, the constructs of glass-containing composites such as, for example glass and glass ceramics are useful, for example, in laser applications where thin, large plates of laser glass requiring efficient cooling and high laser beam quality are desirable. Particular to large glass structures, which have thus far suffered from structural deficiencies, the glass-containing composites of the present invention effectively by-pass these deficiencies without using bonding or high bonding temperatures. The relatively low temperatures of the method of the present invention, allow a broader range of glass-containing and non-glass containing substances to be bonded; that is, those substances which are unstable at temperatures near or greater than their melting, or transition, temperature are now bondable, and bonding agents which may present optical quality problems are no longer necessary.

In high-average-power solid state lasers, large plates of laser material have the advantages of efficient cooling and control of thermal gradients which result in higher laser beam quality. Thin large plates which normally lack structural rigidity no longer do, since bonding substances with no active lasing ions to laser/active substances which provide structural support, can now be achieved. However, as previously explained, when bonding agents or high bonding temperatures are used, deformation or distortion of the composites and a subsequent degradation of laser beam quality result. Again, the method of the present invention avoids these problems since neither bonding agents nor high bonding temperatures are necessary.

Furthermore, composites or constructs of the present invention also include silicon-free bodies as well. For example, the laser glasses of the present invention all can be substantially silicon-free and contain at most 1 wt % silica due to contamination from a silica crucible during the melting process. Phosphate based glasses exemplify suitable types of such silicon-free bodies.

The present invention further provides sandwich-like composites comprising a layer of lasing material in the center and non-lasing materials on the outside (and vice versa); lasing material along the lateral edges of a slab of non-lasing material; and combinations of doped and undoped materials, materials with different concentrations of dopant, and materials with laser radiation-adsorbing ions.

In many respects, the bonded glass laminate of the present invention may be considered as a single glass optical filter element from the end users' viewpoint. The present inventors have discovered that glasses bonded according to the protocol of the present invention have superior properties in comparison to conventional glass laminates. For instance, there is absolutely no danger of delamination at the interface of the glass components in the laminates of the present invention. Further, any fracture of the glass laminates made according to the precepts of the present invention do not follow or propagate along the interface between the bonded materials.

Other examples of applications of glass or glass ceramic composites of the present invention are listed below:

Laser glass composites to produce high average power composite slab lasers, for better cooling efficiency, and, therefore, higher pump power deposition without breakage due to thermal shock.

Application of laser radiation absorbing edge cladding layers to laser slabs, to eliminate parasitic oscillations.

Laminates of filter glasses to obtain absorption properties of composites which cannot be achieved in a single glass, without organic or other adhesives.

Joining optical fibers (which mainly comprise very high silica compositions) with a loss-free and reflection free invisible interface.

Bonding low expansion glass ceramics to be used for, e.g., optical mounts configured into shapes which cannot be achieved in any other practical manner.

Making preforms for optical waveguides structures by multiple application of the inventive bonding process, and subsequently redrawing the preform for producing waveguides of lower scatter than possible by ion exchange processes. Such waveguides could include single mode laser devices.

Similarly, producing optical waveguides as above without redrawing, which still results in lower scattering losses than is possible by conventional ion exchange methods.

Making laser glass amplifier plates similar to those of FIG. 5 described hereinafter, but of an octagonal shape which approaches the outline of an ellipse.

Examples of other applications and advantages of the present invention in regard to the embodiments of single-crystal bonding are as follows. For non-glass containing substances such as single crystals, bonding can be done more cheaply and easily under the precepts of the present invention than by traditional composite formation and crystal growing methods. For some crystals, it will be the only method of producing crystals with the required characteristics.

Moreover, in the context of composites formed from single crystals, the present invention provides a safe and economically efficient alternative to applying thin, single crystal layers, having thicknesses of approximately 1 mm or below, onto selected surfaces. For example, if a highly absorbing garnet single crystal layer, having a thickness of approximately 0.1 mm, is required as an edge cladding for two long edges of a GSGG laser slab, it would be highly undesirable to immerse this valuable slab into a flux at elevated temperatures as would be done with conventional practices.

However, the present invention provides substrate crystals of more readily available species, such as for example, GGG, (i.e., gadolinium gallium garnet) having dimensions which are sufficient to provide an edge cladding layer to the GSGG slab. Moreover, the present invention also circumvents the need for having a single crystal strip of the absorbing garnet available in the size required to prepare a composite with the GSGG slab directly—so long as a sacrificial single crystal, such as GGG, is more readily available. Additionally, the methods of the present invention are also applicable to oxide garnet crystal bonding, e.g. Nd:YAG single-crystals, which are highly useful as laser crystals. Further, the garnet crystals can be doped or undoped for purposes of the present invention.

For crystalline substances, the bonding temperature is generally in the range of 0.4 to 0.9 times the melting temperature of the substance to be bonded having the lowest melting temperature.

A further understanding of the nature and advantages of the present invention may be realized by reference to the remaining portions of this specification and the attached drawings.

DETAILED DESCRIPTION OF THE INVENTION

One embodiment of the method of the present invention is to optically contact the surfaces to be bonded, then diffusion bonding the contacted surfaces by gradually heating the surfaces to a particular diffusion bonding temperature (dependent on the particular materials used), followed by the cooling of the bonding surfaces at a rate which prevents thermal shock and allows removal of stress by annealing.

For glass-containing substances such as, for example, glass and glass ceramics, a preferred embodiment of the method of the present invention comprises: (a) optically contacting two or more surfaces of glass-containing substances to form an assembly; (b) placing the assembly onto a precision ground support surface; (c) bonding the contacted surfaces by gradually heating the assembly to a temperature corresponding to approximately 0.8 to about 1.3 times the glass transition temperature of the surface of the respective material being bonded having the lowest glass transition temperature if the substances have differing glass transition temperatures, until the surfaces bond to form a composite; and (d) cooling the composite at a rate which prevents thermal shock and allows the removal of stress by cooling.

Similarly, if the glass-containing substances have about the same glass transition temperature, then the above protocol is equally applicable with the only difference being that the heating temperature is set at about 0.8 to 1.3 times the glass transition temperature for both glass-containing substances.

It is known that glass, or glass-containing substances do not have a definite melting temperature. Hence, bonding temperatures of the present invention are described and measured in relation to the subject materials to glass transition temperatures. For reference, please G. W. McLellan and E. B. Shand, *Glass Engineering Handbook*, 3d Ed., pp. 1–4.

Specifically, for glass or glass-containing substances the transition temperature is the temperature range within which the expansion of the glass makes a transition from ordinary structural expansion to expansion dominated by atomic rearrangement in the glass structure. This temperature range contains the annealing point, defined as the temperature at which the glass possesses a viscosity of $10^{13}$ poise. The maximum bonding temperature used in this invention is below the melting temperature of glass.

Also, other suggested protocol is discussed below.

1. Glasses of differing glass transition temperatures ($T_G$):

The optically contacted composite is heat treated, placing the component with higher $T_G$ on the bottom, and allowing diffusion bonding to occur at a temperature corresponding to the lower $T_G$ of the components or 5°–10° C. above that. The component having the higher $T_G$ is placed on the bottom in order to provide a stabler support during diffusion bonding since it is less affected by the heat treatment than the component having the lower $T_G$.

2. Glasses of same $T_G$:

It is possible to heat treat for diffusion bonding at a temperature below $T_G$ (about 5°–10° C. below), but the treatment time may have to be sustained for a longer duration (for example, 10 hours and more) to obtain a strong bond. While the diffusion bonding proceeds at a slower rate when conducted at a temperature of within 10° C. of the lower $T_G$ of the components than at higher bonding temperatures, an advantage is realized in that a polishing operation after bonding can be abbreviated, if not eliminated altogether. This is because the flatness rehabilitation needed to eliminate distortions caused during high temperature bonding is avoided.

In any event, the present invention is not particularly limited by the above suggested bonding temperatures as the rate and extent of diffusion bonding is a function of either the temperature or duration of the heating treatment.

Also, the thickness of the individual components may vary considerably. In fact, one important application of this present invention is to protect single filter glass parts or diffusion bonded laminates with more durable thin glass sheets (below a thickness of 1 mm, e.g., 0.25 mm) e.g., of a borosilicate glass, either on both sides or on the side only which has to be protected against environmental influences. In this manner, rather nondurable glasses, which is typical of some phosphate-based filter glasses, may become much more readily useful in harsh environments. Clearly, this type of environmental protection is much more effective than vapor-phase deposited thin films of durable oxides such as $Al_2O_3$ or $SiO_2$ because there is no danger of pinholes.

Additionally, the thermal expansion coefficient of the component glasses of a diffusion bonded laminate is also important, particularly for sizes larger than about $1 \times 1$ inch, to prevent failure by cracking due to mechanical stress. The following protocol is advisable in this regard.

The coefficients of thermal expansion (CTE) of the component glasses should be matched within about $\pm 5 \times 10^{-7}/°C$. It is also helpful to heat treat for a longer duration and/or at higher temperature to effect diffusion at the interface which is more extensive and thereby creating a more gradual transition from one glass to the adjacent one. The diffusion process is facilitated when the two (or more) contacting glass components have different $T_G$'s. In this instance, the treatment temperature may be selected as being more than about 10° C. above the lower $T_G$, resulting in increased diffusion at the glass interface.

Also, another arrangement of the present invention involves formation of sandwich laminate structures. That is, two thin glass sheets having a relatively lower CTE property, e.g. borosilicate glasses, are arranged as outside surfaces over an intermediate or middle glass layer having a relatively higher CTE property than the two outer glass sheets, e.g. a phosphate glass. The above-described composite sandwich structure when diffusion bonded as disclosed herein results in a laminate structure which is in compressive stress. Accordingly, such laminates are more resistant against impact and flexural fracture. Further, the above sandwich arrangement can be replicated in a composite glass piece to form any desired number of repetitions thereof.

Additional steps, discussed hereinbelow, may be included among the above-described steps to insure uncontaminated bonding thereof and to obtain distortion-free composites. In the following discussion, these additional steps will be inserted and explained where appropriate.

The comprehensive sequence of steps (including those steps to avoid contamination) to form composite constructs is shown schematically in FIG. 1.

Figure 1A:
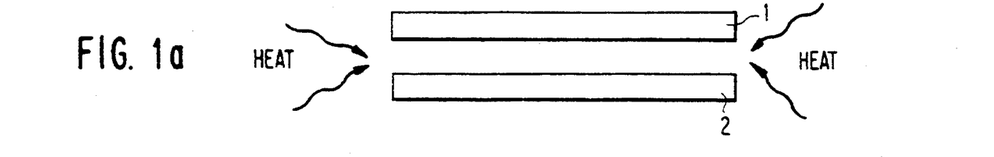
FIG. 1 shows, schematically the comprehensive sequence of steps of this method to form glass-containing composite constructs.
Figure 1B:
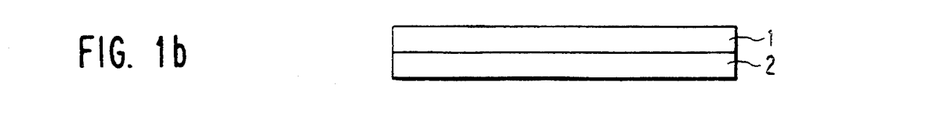

Prior to optical contacting, the surfaces to be bonded are made optically flat by conventional grinding and polishing methods. The flatness must be in the order of one wavelength of visible light per 5 to 10 cm of the surface. As shown in FIGS. 1(a) and 1(b), the surfaces are cleaned, and optionally preheated to remove any adsorbed water or gases, and then assembled (i.e., placed together), as in FIG. 1b, where they are optically contacted and held together by Van der Waals attraction. Depending on the degree of cleanliness desired, the preheating and assembly may be performed in a clean, environment (e.g., a clean room), in a vacuum, or in a helium (or oxygen) filled glove box. If desired, the surfaces may be optically coated with reflection, anti-reflection or polarizing coatings for specific applications.

Figure 1C:
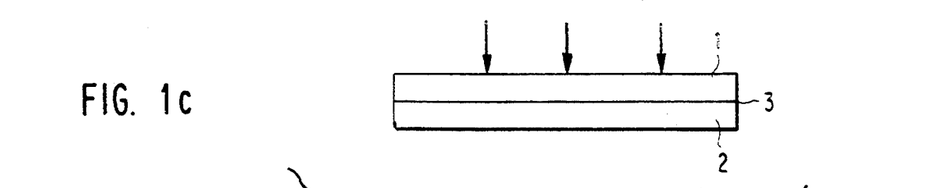

Upon assembling the surfaces, if they are sufficiently close together and clean, interference fringes will be seen immediately. Optical contact is generally indicated by the absence of interference fringes. The interference fringes will be spread out until they are no longer seen. At this point, the surfaces grip each other, but are still separable at the interface by insertion of a sharp tool. This assembly is shown in FIG. 1(c), where the pressure shown is optional and not required. Further, to insure that no water or other contaminant enters between the surfaces, the interface may be sealed at room temperature with plastic.

In the simplest procedure, the optical contacting process may be performed under ambient conditions in a clean room. For example, a dust-free environment was used in a method disclosed in U.S. Pat. No. 3,565,508. To minimize the possibility of air pockets being formed at the interface, optical contacting may be performed inside a vacuum glove box. Alternatively, a glove box filled with helium gas can be used, which is easily and quickly diffused out of the interface, thereby keeping it free of gaseous contamination.

Figure 1D:
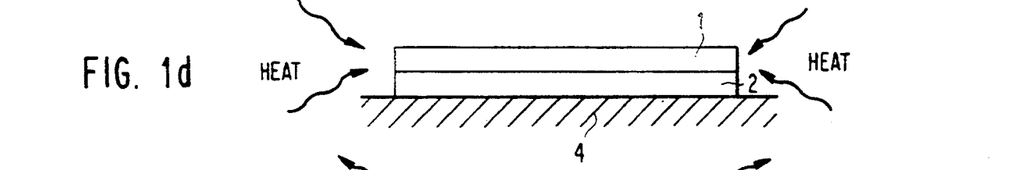

In another embodiment of the present invention, after optical contacting, the sealed assembly is preferably placed on a precision ground support surface 4 and gradually heated to combine the elements into a permanently bonded composite construct 5 as shown in FIG. 1(d). The support surface may consist of, for example, graphite, polycrystalline ceramic, or fused silica and may be coated with a release agent, boron nitride, graphite, or any other suitable material. Additionally, other glass release agents may be used.

The elements are permanently bonded in this present method despite not becoming molten; this is due to diffusion at the optically contacted interface. Such diffusion phenomenon can involve the migration of ionic constituents of the glass towards and across the glass interface zone. This diffusion bonding method requires longer holding times (in the order of 8 to 50 hours depending on substance, temperature, pressure, and other factors), but because the surfaces do not become molten, the optical contact remains true, and there is no measurable distortion at either the interface or surfaces. There is also less likelihood of dust and gas bubbles at the interfaces which may act as centers of scattering and radiation damage. Thus, high optical quality and homogeneity in the bonding composite is achieved.

Since the extent of diffusion increases with time and is approximately proportional to the square root of the time allowed for diffusion, interfaces of lower scatter may be obtained when employing bonding times of about two or four weeks. With the glass or glass-containing composites, if shorter holding times are desired, heating may be increased to 1.1 to about 1.3 times the glass transition temperature. Also, since the temperatures are relatively low, optical distortion effects are minimized.

The absence of a bonding agent or intermediate bonding film allows the surfaces to be easily separated after optical contacting, but prior to bonding, to remove impurities or to further prepare the surfaces by polishing or adding special optical coatings. Also, distortion derived from the optical characteristics of bonding agents are completely avoided. The ability to use low temperatures, made possible with this method, also allows a wider choice of materials useful for the individual layers.

In those cases where preheating the surfaces to be bonded is not necessary, the initial assembly of the elements before heat treatment can be carried out at room temperature which greatly facilitates the handling of the elements when compared to methods utilizing molten materials. Again, to further prevent contamination, the bonding process may be performed in a vacuum furnace or in a dry oxygen or helium environment.

Figure 1E:
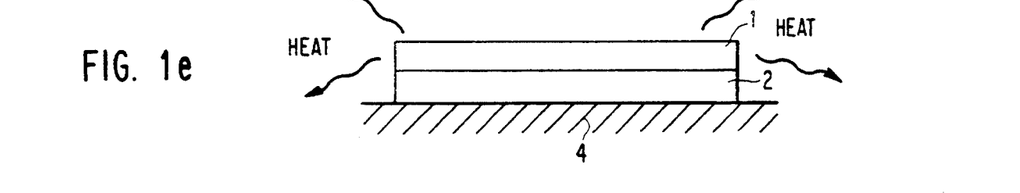

In any event, after heating the glass-containing composite for the requisite holding time, the composite is cooled at a rate which allows annealing of residual stresses. This is illustrated in FIG. 1(e). Heating causes the release of existing stresses within the crystalline and atomic structures to be alleviated; however, cooling must be conducted at a sufficiently slow rate so that the stresses will not reappear. This process is commonly referred to as "annealing". Further, where the elements to be bonded are not the same, the rate of cooling is determined by the relevant surfaces, coefficients of thermal expansion, which should match within $1-2\times 10^{-7}/°C.$, depending on the amount of stress birefringence allowable for the particular case and the dimensions of the respective elements.

The method of the present invention may also be used to facilitate grinding of the structures to the desired thinness and polishing to optical flatness. It is generally difficult to grind and polish thin plates since they lack structural rigidity. However, if two thicker plates are first bonded, using the above described methods, the composite may be ground and polished to the desired thinness while working with a structure of greater mechanical strength. Thus, layer thicknesses in the order of 0.1 mm are possible with support from other layers. Moreover, optical flatnesses in the order of one half wavelength are possible. If desired, the composite may then be bonded to another element and the process repeated. Conversely, the bonding process makes simple construction of thick composites possible if that is desired.

As for assembly orientation, when the method of the present invention is used, it is not necessary that the layers to be bonded rest horizontally one upon the other, since the bonding temperatures are not significantly above the transition temperature and distortion or displacements due to gravitational effects are less severe. Thus, the elements may be assembled in any convenient position.

Correspondingly, FIGS. 2-5 are illustrative of embodiments directed to glass or glass-containing constructs having utility, for example, as high average power lasers.

Figure 2:
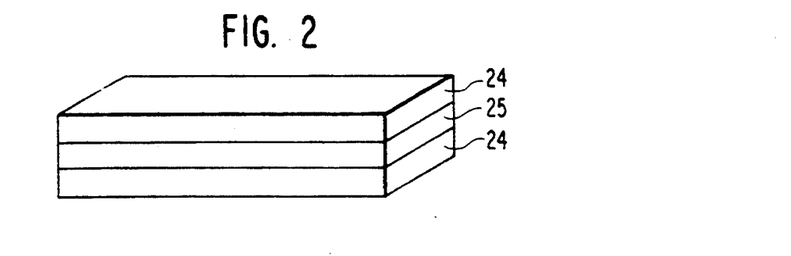
FIG. 2 shows a glass-containing composite construct of the present invention.

FIG. 2 shows two layers of glass 24 doped with laser active ions (such and $Nd^{3+}$) bonded to a central layer of undoped glass 25 in a sandwich-like structure where the undoped glass 25 adds mechanical rigidity while the lasing-effective layers 24 are still thin (as desired for thermal gradient control and lasing efficiency as described previously).

Figure 3:
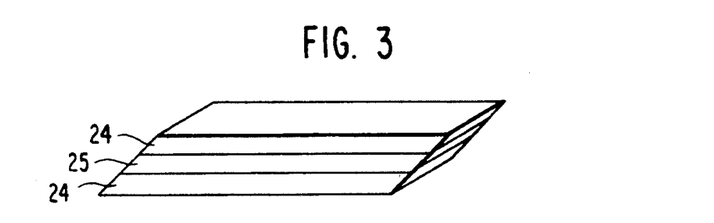
FIG. 3 shows a sandwich-like construct where a layer of undoped glass adds mechanical rigidity to thin laser-active layers.

FIG. 3 shows the same construct as FIG. 2, after grinding and polishing to an exemplary desired shape.

Figure 4:
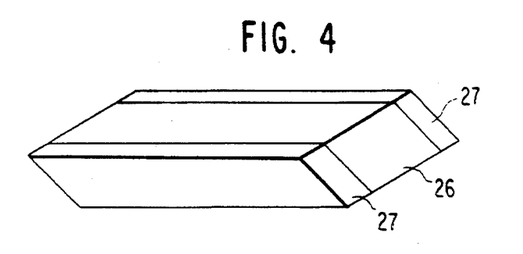
FIG. 4 shows a sandwich-like construct after grinding and polishing to an exemplary desired shape.

FIG. 4, shows another embodiment where a slab of laser active glass 26 is bonded to two layers of glass 27 containing absorbing ions such as $Cu^{2+}$ or $Sm^{3+}$ to better control the laser beams by absorbing spontaneous emission. For a $Nd^{3+}$-doped glass layer, the assembly and bonding can be performed in a clean environment in a single step. If necessary, the technique of first bonding, and then grinding and polishing to the desired thinness and recontacting may be used.

Figure 5:
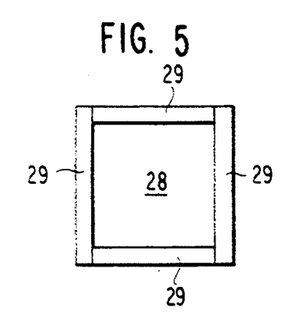
FIG. 5 shows a slab of laser active glass bonded to two layers of glass-containing laser radiation-absorbing ions to control the laser beams by absorbing spontaneous emission.

FIG. 5 shows another embodiment of a construct of the present invention in the form of a square laser amplifier plate 28 bounded on four sides by layers of glass 29 containing absorbing $Cu^{2+}$ ions.

The glass can have different dopant concentrations and indices of refraction, again, depending on the intended application. Both doped and undoped fused silica have been bonded successfully using the method of constructs of the present invention. For purposes of filter glass laminate applications of the present invention, suitable glass compositions include a Hoya Glass designated MSL554G, described hereinafter, as well as glass compositions similar to MSL554G, but with addition of $SiO_2$ and/or $GeO_2$ to reduce the thermal expansion coefficient to a value close to that of 058 glass, also described hereinafter.

In general, with regard to the use of glass or glass-containing substances, both low and high temperature glass or glass ceramics are useful in the present invention. In the case of low expansion glass ceramics or fused silica structures, they may be used for bonding elements of large mirror substrates, with the high precision needed for optical instruments. Additionally, the present invention is the only method for bonding high temperature materials, such as, for example, quartz glass and low expansion glass ceramics without bonding agents. Also, non-flat optical structures, such as, for example, prisms, plano-convex or plano-concave lenses may be formed, hereby.

Thus, embodiments of the present invention include all constructs which achieve a level of optical homogeneity resulting from (1) bonding temperatures lower than the glass transition temperature of one of the respective materials being bonded, and (2) the lack of a bonding agent.

Figure 6:
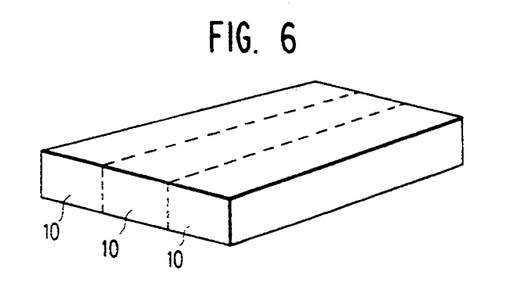
FIG. 6 shows the fabrication of large slabs of single crystals from readily available single crystal boules.
Figure 9:
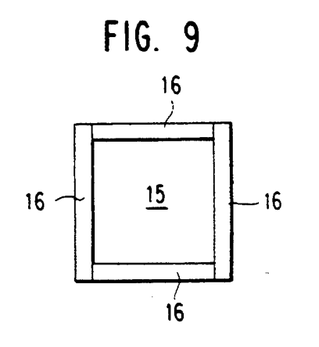
FIG. 9 shows an embodiment of a construct of the present invention in the form of a square laser glass amplifier plate bounded on four sides by layers of a glass containing (or, analogously, single crystal) material containing absorbing ions.

Other embodiments of the composite constructs of the present invention are shown in FIGS. 6 and 9. These examples relate to single crystal materials for high average-power lasers.

Unlike the glass or glass-containing substances, however, the bonding temperatures for crystalline containing substances such as, for example, single crystals, are described and measured in relation to their melting temperatures. Preferably, in regards the bonding step described above, and where the composite comprises crystalline containing substances, the composite is heated to a temperature ranging from about 0.4 to about 0.9 times the value of the lower of the respective surfaces melting temperature.

FIG. 6 shows schematically a construct formed by the bonding of three single crystal boules 10 oriented with their crystalline axes parallel with each other. More specifically, this is an example of the fabrication of large slabs of single crystals from readily available single crystal stock. The layers may be pure or doped with laser-active ions or laser radiation-absorbing ions, depending on the intended application. All permutations of crystals, pure or doped, with laser-active ions, laser radiation-absorbing ions, and solarization-preventing ions in the three layers are possible, depending on the intended application. For examples the outside layers may contain laser-active ions and the central layer solarization-preventing ions.

Furthers the dopant concentrations may be different depending on the intended applications and the indices of refraction of the materials may be different for certain optical purposes. In addition, magnetic, dielectrics ferroelectric, piezoelectric and other physical properties of the crystalline materials used may be exploited in these constructs for various purposes. Particular substances may also be used, such ass for example, dielectric oxides carbides nitrides, borides, silicides, metals, and optical plastics.

Figure 7:
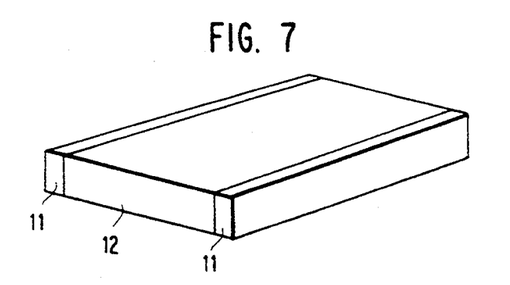
FIG. 7 shows single crystal edge claddings doped with laser radiation absorbing ions bonded to a single crystal central slab of laser material (or, analogously, glass)

FIG. 7 shows another embodiment of a construct of this invention. A single crystal edge cladding 11 is doped with laser radiation absorbing ions and bonded to a single crystal central slab of laser material 12, such as for examples Nd:YAG, Nd, Cr:GSGG, or Nd:YLF (i.e., $Cu^{2+}$, $Cr^{2+}$, $Cr^{4+}$, $Sm^{3+}$) to help to control the laser beam by absorbing spontaneous emissions. Alternatively, at least one of laser active ions and solarization-preventing ions are provided in the single crystal central slab and at least one of laser active ions and solarization-preventing ions are provided in the single crystal edge cladding.

Figure 8:
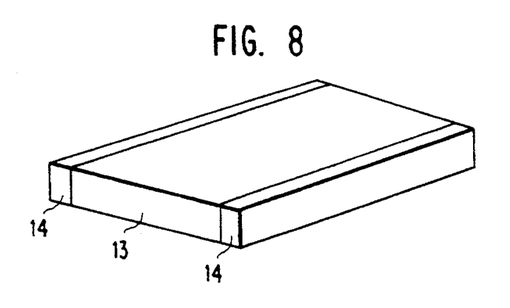
FIG. 8 shows an embodiment of bonded dissimilar materials with a central slab of single crystal laser material and glass edge claddings doped with laser radiation absorbing ions.

FIG. 8 shows an embodiment of bonded dissimilar materials. The central slab 13 is single crystal laser material and the edge claddings 14 are glass doped with laser radiation absorbing ions. The glass may provide structural rigidity to the crystal and the absorbing ions help to control the laser beam by absorbing spontaneous emissions.

FIG. 9 shows an embodiment of a construct of the present invention, in the form of a square laser amplifier plate 15 bounded on its four sides by layers of a crystalline material 16 containing absorbing $Cu^{2+}$ ions.

Also, the cleaning method used to remove any traces of organic contaminants from the single crystal surfaces to be bonded is important, particularly for single crystals such as Nd:YAG. In this regard, the present inventors have discovered a cleaning method wherein the single crystal part to be cleaned is immersed into a molten nitrate salt at a temperature of about 300° to 350° C. for a brief period of time. This cleaning process has general applicability and also is nonpolluting since no organic cleaning solvents are used.

For the purposes of giving those skilled in the art a better understanding of the present invention, the following non-limiting, illustrative examples are given.

EXAMPLE 1

This example illustrates a successful bonding of crystal substances. Two layers of 27.9×9.7×4.6 mm GSGG crystals were optically contacted under ambient conditions using an aero duster. The assembly was heated at a rate of 2° C./min., held at 950° C. for 16 hours, and cooled at a rate of 1° C./min.

EXAMPLE 2

The following is an example illustrating the formation of epitaxially grown layers from commonly available substrate crystals. An epitaxially grown layer of an absorbing single crystal of about 1 mm thickness is obtained on the GGG substrate crystal (which may consist of a strip having a thickness ranging from about 3 mm to about 10 mm), by methods known by those skilled in the relevant art. The epitaxially grown layer is then ground and polished. Then, a composite is prepared between the GSGG slab edges to be clad with the composite layer supported by the GGG strip. Finally, the GGG strip is ground completely off thereby leaving a composite of GSGG with an edge cladding of the desired absorbing single crystal species at the required thickness.

EXAMPLE 3

This example illustrates a successful bonding of crystal substances. Two layers of 27.9×9.7×4.6 mm GSGG crystals were optically contacted under ambient conditions using an aero duster. The assembly was heated at a rate of 2° C./min., held at 950° C. for 16 hours, and cooled at a rate of 1° C./min.

The resulting composite was used to fabricate 15 specimens of about 4×4 c30 mm³, with the diffusion bonded interface in the middle. The specimens were broken in tensile fracture. Surfaces of fractures exhibited a random pattern, with strength values around 350 MPa. Only in the case of imperfect bonding due to impurities inadvertently existing at the interface was fracture incurred partly along the interface and, in these instances, with much reduced fractural strength values resulting.

A comparison of the strength values of the above fracture specimens obtained from bonded crystals of the present invention with the strength values of fracture specimens obtained from non-bonded single crystals revealed the same strength values.

While preferred embodiments have been shown and described, various modifications and substitutions may be made thereto without departing from the spirit and scope of the present invention. Accordingly, it is understood that the present invention has been described by way of illustration, and not limitation.

What is claimed is:

1. A device having optical homogeneity, prepared by a process comprising the steps of:
   (a) optically contacting surfaces of first and second single crystal materials to form an assembly;
   (b) bonding said optically contacted surfaces of step (a), by gradually heating said surfaces to a temperature below the fusion temperature of said surfaces, but at a temperature and for a time sufficient to diffusion bond said surfaces of said first and second materials; and
   (c) cooling the bonded structure of step (b) at a rate which allows the removal of stress by annealing, wherein a bonding agent or bonding film is not present between said bonded first and second single crystal materials.

2. A device according to claim 1, wherein the single crystal containing materials have about the same melting temperature and the bonding temperature of step (b) is a temperature corresponding from about 0.4 to about 0.9 times the value of the melting temperature of the materials.

3. A device according to claim 1, wherein said first and second single crystal materials have substantially the same coefficients of thermal expansion.

4. A device according to claim 1, wherein the first and second crystal materials are gadolinium scandium gallium garnet crystals.

5. A device according to claim 1, wherein the first crystal material is doped with at least one of laser radiation-absorbing ions, laser-active ions, or solarization-preventing ions.

6. A device according to claim 5, wherein the second crystal material is doped with at least one of laser radiation-absorbing ions, laser-active ions, or solarization-preventing ions.

7. A device according to claim 1, wherein the second crystal material is doped with at least one of laser radiation-absorbing ions, laser-active ions, or solarization-preventing ions.

8. A device according to claim 1, wherein the first crystal material is comprised of at least two parts bonded as edge cladding to the second crystal material.

9. A device according to claim 1, wherein the first and second materials have different indices of refraction.

* * * * *